United States Patent
Field

(10) Patent No.: US 6,535,005 B1
(45) Date of Patent: Mar. 18, 2003

(54) SYSTEMS AND METHODS FOR OBTAINING AN ELECTRICAL CHARACTERISTICS OF A CIRCUIT BOARD ASSEMBLY PROCESS

(75) Inventor: Daniel Field, Northboro, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/558,638

(22) Filed: Apr. 26, 2000

(51) Int. Cl.[7] .................................................. G01R 1/06
(52) U.S. Cl. ...................... 324/755; 324/158.1; 324/765
(58) Field of Search .............................. 324/754, 158.1, 324/755, 765, 763; 174/260, 261, 266; 361/760, 777, 715, 718, 719, 200

(56) References Cited

U.S. PATENT DOCUMENTS

| | | | | |
|---|---|---|---|---|
| 4,437,229 A | * | 3/1984 | Bitler et al. ................... 29/593 |
| 5,436,558 A | * | 7/1995 | Saitoh et al. ................ 324/763 |
| 5,459,287 A | * | 10/1995 | Swamy ........................ 174/266 |
| 5,485,080 A | * | 1/1996 | Larrabee et al. ............. 324/763 |
| 5,541,547 A | * | 7/1996 | Lam ............................ 324/763 |
| 5,548,224 A | * | 8/1996 | Gabriel et al. ............... 324/765 |
| 5,638,006 A | * | 6/1997 | Nariani et al. ............... 324/765 |
| 5,784,262 A | * | 7/1998 | Sherman ..................... 361/777 |
| 5,789,933 A | * | 8/1998 | Brown et al. ................ 324/765 |
| 5,801,536 A | * | 9/1998 | Brambilla et al. ........... 324/763 |
| 5,831,441 A | * | 11/1998 | Motooka et al. ............. 324/763 |
| 5,859,538 A | * | 1/1999 | Self ............................. 324/755 |
| 5,883,521 A | * | 3/1999 | Nishikawa ................... 324/763 |
| 5,896,037 A | * | 4/1999 | Kudla et al. ................. 324/763 |
| 6,020,749 A | * | 2/2000 | Moris et al. ................. 324/755 |
| 6,075,710 A | * | 6/2000 | Lau ............................. 361/760 |
| 6,091,252 A | * | 7/2000 | Akram et al. ................ 324/755 |
| 6,121,554 A | * | 9/2000 | Kamikawa ................... 174/260 |
| 6,194,668 B1 | * | 2/2001 | Horiuchi et al. ............. 174/261 |

* cited by examiner

*Primary Examiner*—Michael Sherry
*Assistant Examiner*—Jimmy Nguyen
(74) *Attorney, Agent, or Firm*—David E. Huang, Esq.; Chapin & Huang, L.L.C.

(57) ABSTRACT

The present invention is directed to techniques for obtaining an electrical characteristic of a circuit board assembly process which involves mounting a module to an installation location of a circuit board using the circuit board assembly process, and measuring leakage current of the test structure in response to an electrical signal (e.g., a voltage) applied to the installation location. One can then determine the surface insulation resistance (SIR) of the test structure based on the electrical signal and the leakage current in order to assess the suitability of the circuit board assembly process. One arrangement of the invention is directed to a system for obtaining an electrical characteristic of a circuit board assembly process. The system includes a test structure having (i) a circuit board having a module installation location and an interface location in electrical communication with the module installation location, and (ii) a module which is mounted to the circuit board at the module installation location using the circuit board assembly process. The system further includes a signal generator that couples to the interface location of the circuit board, and that applies an electrical signal to the module installation location of the circuit board through the interface location. Additionally, the system includes a detector that that couples to the interface location, and that measures leakage current of the test structure in response to the electrical signal. The leakage current is itself an obtained electrical characteristic of the circuit board assembly process. However, the leakage current and the electrical signal enable determination of surface insulation resistance of the test structure, as another electrical characteristic of the circuit board assembly process.

35 Claims, 10 Drawing Sheets

SYSTEMS AND METHODS FOR OBTAINING AN ELECTRICAL CHARACTERISTICS OF A CIRCUIT BOARD ASSEMBLY PROCESS

BACKGROUND OF THE INVENTION

A typical circuit board assembly process involves creating a circuit board and populating the circuit board with a variety of circuit board modules. In general, a circuit board manufacturer combines layers of non-conductive material (e.g., fiberglass or plastic) and conductive material (e.g., copper) into a rigid sheet. The manufacturer then mounts modules, i.e., circuit board components such as integrated circuits (ICs), capacitors, resistors, connectors, etc., onto installation locations (part attachment fields) of the circuit board in order to form a circuit board assembly. Finally, the manufacturer tests (and perhaps programs) the circuit board assembly to verify proper operation prior to releasing the circuit board assembly for commercial use.

On occasion, a manufacturer may determine that a particular portion of a circuit board assembly (e.g., a particular module installation location, an etch or trace location, a component, etc.) is a cause of improper circuit board assembly operation. In some situations, the cause is excess solder or debris on the surface of the circuit board (e.g., solder flux remnants and impurities). For example, a particular mounting process that mounts a lead frame IC package to a particular installation location of a circuit board can use a particular solder that leaves a large amount of solder flux residue on the surface of the circuit board. Such residue can lower the surface insulation resistance (SIR) of the circuit board causing a large amount of leakage current to flow between solder joints of the circuit board assembly. Often, the manufacturer can visually detect the residue and remove it (e.g., by washing the circuit board with a special cleaning solution or bath, by blowing air under and around the lead frame package, etc.). Furthermore, the manufacturer can visually inspect other circuit board assemblies to determine whether such residue is common to the circuit board assembly process or an isolated incident. If the residue is common to the circuit board assembly process, the manufacturer can modify the process to remedy the situation. For example, the manufacturer can reduce the residue by improving a cleaning procedure performed on the circuit board assemblies after the mounting process, or by changing the type of solder or flux used during the mounting process.

Some circuit board manufacturers perform stress tests on a sample of circuit board assemblies to determine how the circuit board assemblies will behave after an extended period of real-world use. That is, the manufacturers put the sample of the circuit board assemblies through a variety of environmental stresses (e.g., high temperatures, high humidity, high or prolonged vibration, etc.) which attempt to duplicate extreme real-world operating conditions, and/or accelerate aging of the circuit board assemblies. The manufacturer interprets the results of such tests as an indicator of the suitability of the circuit board assembly process and hopes that such tests will reveal circuit board assembly anomalies that could surface after a period of use. For example, the manufacturer may determine that a circuit board assembly process is unsuitable because solder joints formed during the module mounting process tend to weaken and break over time. The manufacturer can then improve the circuit board assembly process in order to avoid such anomalies in the future (e.g., by changing the temperature applied during the soldering process, by changing the type of solder used, by changing the dimensions or tolerances of pins and/or vias forming the solder joints, etc.).

Some circuit board manufacturers form test boards for testing particular attributes of a circuit board assembly process. One such test involves validating continuity between a test board and a special module which is mounted to the test board using a new circuit board assembly process. In this test, a manufacturer creates a test board, and solders the special module to a designated test board location in order to form a single conductive pathway through all of the solder joints holding the module to the test board. That is, conductive material within the module and within the test board connects the solder joints to form a single daisy chained pathway. After completion of the assembly process, the manufacturer verifies that the module and the test board properly form the single low-resistance pathway (i.e., verify continuity from one end of the pathway to the other), and subsequently subject the test board to a series of stresses that age the test board. Then, the manufacturer tests continuity between the module and the test board (i.e., repeat the continuity test) in order to determine whether the assembly process adequately mounted the module to the test board (i.e., in order to confirm that the assembly process mounts the module to the test board sufficiently to withstand the stresses).

Another test involves a manufacturer forming a comb structure on a test board using a particular circuit board assembly process. The comb structure generally mimics line width and spacing patterns to be implemented on particular circuit boards for commercial use. Such a comb structure includes conductive material on a surface of the test board. The conductive material forms an open pattern of straight, laterally-extending etch runs which can receive a first voltage (e.g., $V_{SS}$ of 10 to 100 volts) and a second voltage (e.g., $V_{GND}$ of 0 volts) in an interleaved manner. A manufacturer then applies the first and second voltages to the comb structure, and measures leakage current between the etch runs. In an optimal situation, the resistance is expected to be high, e.g., on the order of $10^6$ to $10^8$ ohms per square centimeter. In this configuration, cells formed between a first voltage etch and a second voltage etch provide straight voltage gradient lines which extend longitudinally between the laterally-extending etch runs (i.e., perpendicularly to the laterally-extending etch runs). The manufacturer then determines the surface insulation resistance (SIR) for the area of the comb structure by dividing the voltage difference (e.g., 10 volts) by the measured leakage current. This SIR is an indicator of the circuit board which the manufacturer can routinely expect when manufacturing commercial circuit boards having similar line width and spacing patterns. Typically, circuit board assembly processes that provide low SIRs are more susceptible to signal integrity anomalies, i.e., damage to the circuit boards from current leakage over a long-term can tend to weaken insulation properties between particular etches or traces resulting in circuit board assembly failures after a period of normal operation.

Occasionally, if there is surface area available, a circuit board manufacturer may place such a comb structure in a coupon on a commercial circuit board away from any mounted parts. This enables the circuit board manufacturer to obtain SIR information on the actual commercial circuit board. The Institution for Interconnecting and Packaging Electronic Circuits (IPC) of Northbrook, Ill. and other electronic trade organizations provide other test patterns and procedures for assessing the quality of circuit board assembly processes.

SUMMARY OF THE INVENTION

A circuit board may properly pass initial tests and inspections prior to its release by a circuit board manufacturer only to fail after a period of time (e.g., a year) of normal operation. The circuit board manufacturer may be able to isolate the cause of the failure to a particular module or module installation location. Occasionally, the circuit board manufacturer may be able to identify the exact cause of the failure. For example, if the module has a lead frame package, the manufacturer may be able to visually inspect the solder joints connecting the module to the circuit board and determine whether any debris or contaminants have caused a large amount of leakage current to flow between two solder joints. If such is the case, the manufacturer may be able to modify the circuit board assembly process (e.g., more thoroughly clean or wash the circuit boards prior to testing and shipping).

However, in some situations, the manufacturer may be unable to visually inspect a module or module installation location. For example, Ball Grid Array modules tend to have several rows and columns of solder joints and when mounted, reside only 0.005 to 0.020 of an inch over the circuit board, thus preventing visual inspection of each solder joint. Although the manufacturer may be able to inspect the module and module installation location using other means (e.g., using X-ray technology), such other means are often time consuming, expensive and less reliable than visual inspection. Accordingly, it may be prudent for the manufacturer to take additional testing steps prior to manufacturing a newly designed circuit board on a large scale, particularly if the circuit board includes a new or questionable technology such as (i) implementing a finer contact pitch (e.g., a contact pitch of 1.0 mm, 0.8 mm or 0.6 mm on a large BGA module), or (ii) using new solder/flux material.

Unfortunately, the conventional approaches to forming a test board in order to test particular circuit board assembly processes suffer from certain drawbacks. For example, a circuit board manufacturer which forms a daisy chain configuration between a special module and a test board can test the configuration to verify proper installation of the module, i.e., that continuity exists through a single conductive pathway formed by daisy chaining solder joints between the module and the test board). However, the manufacturer typically finds the configuration to be of little use in determining the leakage current or SIR of the test board since a relatively large amount of current generally passes through the pathway when the module is properly installed on the test board.

Furthermore, a manufacturer which forms a comb structure on a test board (i.e., open, interleaved, straight etch runs of positive and ground voltages) can measure leakage current through the comb structure, but the comb structure is not a normal circuit feature. That is, the comb structure does not accurately duplicate certain configurations or structures occurring on operating circuit boards with operating components, coatings, etc. For example, the comb structure is not well suited to the smaller dimensions used with current and future Ball Grid Array (BGA) technologies which provide multiple module/circuit board connections in a relatively small area. Rather, the comb structure merely mimics general line width and spacing patterns. Accordingly, leakage current measured through the comb structure, and any resulting SIR calculated from that leakage current are not accurate representations of electrical properties existing where a BGA module is mounted to the circuit board, i.e., a location that is susceptible to SIR anomalies (e.g., shorts between solder joints due to debris, the closeness of the solder joints, contaminant entrapment, etc.).

In contrast, the present invention is directed to techniques for obtaining an electrical characteristic of a circuit board assembly process which involves mounting a module to an installation location of a circuit board using the circuit board assembly process in order to form a test structure, and measuring leakage current of the test structure in response to an electrical signal (e.g., a voltage of 10 to 20 volts) applied to the installation location. The module mounted on the test structure more closely duplicates the situation of a mounted operating module on an operating circuit board using the same or similar circuit board assembly process than a conventional comb structure on a test board. Furthermore, one can determine the SIR of the test structure based on the electrical signal and the leakage current in order to assess the suitability of the circuit board assembly process. Such a determination cannot be made in the conventional test board approaches such as that of mounting a module on a test board to form a daisy chain pathway. Accordingly, a circuit board manufacturer can duplicate the physical construction to be employed in an operating circuit board (e.g., a real commercial circuit board device), and allow more accurate measurements of the electrical properties of that circuit board. As a result, the manufacturer can validate a particular circuit board assembly process or determine whether the particular circuit board assembly process is suitable, e.g., certify that the materials used are resistive enough, confirm that the process is "clean" (i.e., not hindered by flux debris or contaminants), test the interaction of materials (e.g., corrosion), test for thermal coefficient of expansion mismatches, etc.

One arrangement of the invention is directed to a system for obtaining an electrical characteristic of a circuit board assembly process. The system includes a test structure that includes (i) a circuit board having a module installation location and an interface location in electrical communication with the module installation location, and (ii) a module which is mounted to the circuit board at the module installation location using the circuit board assembly process. The system further includes a signal generator that couples to the interface location of the circuit board, and that applies an electrical signal to the module installation location of the circuit board through the interface location. Additionally, the system includes a detector that that couples to the interface location, and that measures leakage current of the test structure in response to the electrical signal. The leakage current is itself an obtained electrical characteristic of the circuit board assembly process. Nevertheless, the leakage current and the electrical signal enable determination of surface insulation resistance of the test structure, as another electrical characteristic of the circuit board assembly process.

In one arrangement, the module includes a Ball Grid Array (BGA) package. For this arrangement, the circuit board assembly process includes a BGA component mounting process. In this arrangement, determination of the SIR provides an indication of the adequacy of the BGA component mounting process. In some situations, a circuit board manufacturer can use the techniques of the invention to determine the suitability of a particular BGA component mounting process for a particular pitch or connection density between a BGA module and a circuit board. For example, an extremely low SIR for the test structure can indicate that a module having a particular BGA footprint is unsuitable due to the low SIR.

In one arrangement, the module installation location of the circuit board includes (i) a set of first circuit board contacts which are electrically connected together, and (ii) a set of second circuit board contacts which are electrically connected together. In this arrangement, the module includes (i) a set of first module contacts which connects with the set of first circuit board contacts, and (ii) a set of second module contacts which connects with the set of second circuit board contacts and which is electrically isolated from the set of first module contacts. Preferably, the electrical signal is a voltage (e.g., 10 to 20 volts) applied between the set of first circuit board contacts and the set of second circuit board contacts in order to determine, as the electrical characteristic, a surface insulation resistance of the test structure based on the voltage and the leakage current.

In one arrangement, the module and the circuit board form a set of repetitive cells when the electrical signal is applied to the module installation location of the circuit board. Each cell has voltage gradient lines which radially extend between solder joints connecting the module to the circuit board. Since the voltage gradient lines of the cells extend radially, the cells are different than conventional cells having laterally extending voltage gradient lines. Such repetitive cell information enables improved predictability for similar implementations. In one arrangement, there are a large number of cells (e.g., several hundred) which provide an amplified effect for easier measurement and quantification, i.e., that provide values that are high enough to be measured by standard test equipment.

In one arrangement, the module installation location of the circuit board includes an array of contacts and a set of electrical connections. In this arrangement, each contact of an inner portion of the array has four immediately adjacent neighboring contacts. Additionally, the set of electrical connections connects each contact of the inner portion to a contact other than one of the four immediately adjacent neighboring contacts of that contact.

One arrangement involves exposing the test structure to an extreme environmental condition (e.g., high temperature and high humidity) for a period of time in order to stress the test structure prior to applying the electrical signal and measuring for leakage current. Power can also be applied to the test structure (e.g., a voltage bias) as an accelerating factor during such exposure. Such exposure provides for accelerated aging or worst case operating conditions for the test structure in order to determine how the test structure or a similar circuit board assembly will perform under extreme operating conditions.

The features of the invention, as described above, may be employed in circuit boards, systems and related devices such as those manufactured by EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The invention is directed to techniques for obtaining an electrical characteristic of a circuit board assembly process by mounting a module to an installation location of a circuit board using the circuit board assembly process in order to form a test structure, and measuring leakage current of the test structure in response to an electrical signal (e.g., a voltage) applied to the installation location. The module mounted on the test structure closely duplicates a situation of a mounted operating module on an operating circuit board using the same or a similar circuit board assembly process. Additionally, in one arrangement, one can determine the surface insulation resistance (SIR) of the test structure based on the electrical signal and the leakage current in order to assess the suitability of the circuit board assembly process. The techniques of the invention may be employed in circuit board testing systems and methods, and other related devices such as those manufactured by EMC Corporation of Hopkinton, Mass.

Figure 1:
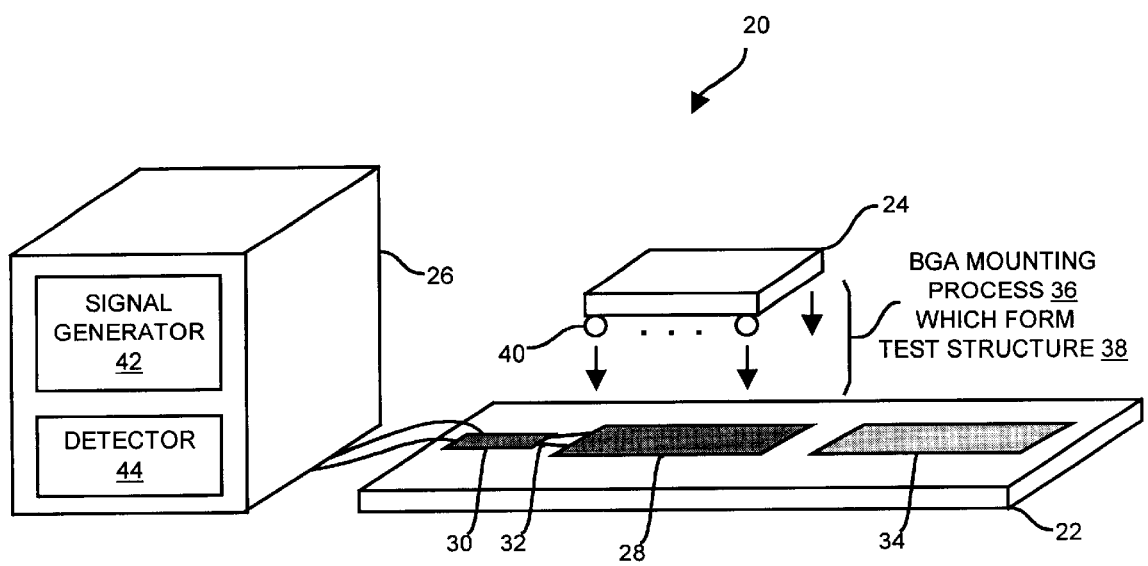
FIG. 1 is a diagram of a system that uses a test structure, which includes a module and a circuit board, to obtain an electrical characteristic of a circuit board assembly process.

FIG. 1 shows a system 20 for obtaining an electrical characteristic of a circuit board assembly process, and which is suitable for use by the invention. The system 20 includes a circuit board 22, a module 24 and equipment 26. The circuit board 22 includes a module installation location 28, an interface location 30, conductive material 32 connecting the interface location 30 with the module installation location 28, and optionally other circuitry 34.

In one arrangement, the circuit board 22 is manufactured exclusively for testing purposes such that the other circuitry 34 includes circuit board structures for other tests, e.g., module installation locations for other modules. Accordingly, a circuit board manufacturer can use the invention by providing a circuit board having multiple module installation locations of differing contact pitches (e.g., 1.27 mm, 1.0 mm, 0.8 mm and 0.6 mm), and test each location to determine how close the solder connections can be brought together before leakage current becomes a problem.

In another arrangement, the circuit board 22 is manufactured for commercial purposes and the circuitry 34 includes operating circuitry, e.g., standard circuit board modules such as processors, memory, application specific integrated circuits (ASICs), individual electronic components (e.g. resistors, capacitors, transistors, diodes, etc.), connectors, etc.

The circuit board assembly process includes a mounting process 36 that mounts the module 24 to the circuit board 22 to form a test structure 38. As shown in FIG. 1, and by way of example only, the module 24 is a Ball Grid Array (BGA) component having solder balls 40 which form solder joints with contacts of the module installation location 28 during a BGA mounting process (i.e., the mounting process 36).

Once the module 24 is mounted to the module installation location 28 of the circuit board 22, the equipment 26 can access the module installation location 28 through the interface location 30. The equipment 26 includes a signal generator 42 and a detector 44. The signal generator 42 applies an electrical signal (e.g., a voltage) to the module installation location 28 of the circuit board 22 through the interface location 30. The detector 44 measures an electrical characteristic of the test structure formed by the circuit board 22 and the module 24. In one arrangement, the detector 44 measures leakage current through the test structure 38 in order to determine the SIR of the test structure 38 (i.e., of the module installation location 28). In one arrangement, an optimal SIR is a high resistance in the range of $10^8$ to $10^{12}$ ohms/cm$^2$. Further details of the invention will now be provided with reference to FIG. 2.

Figure 2:
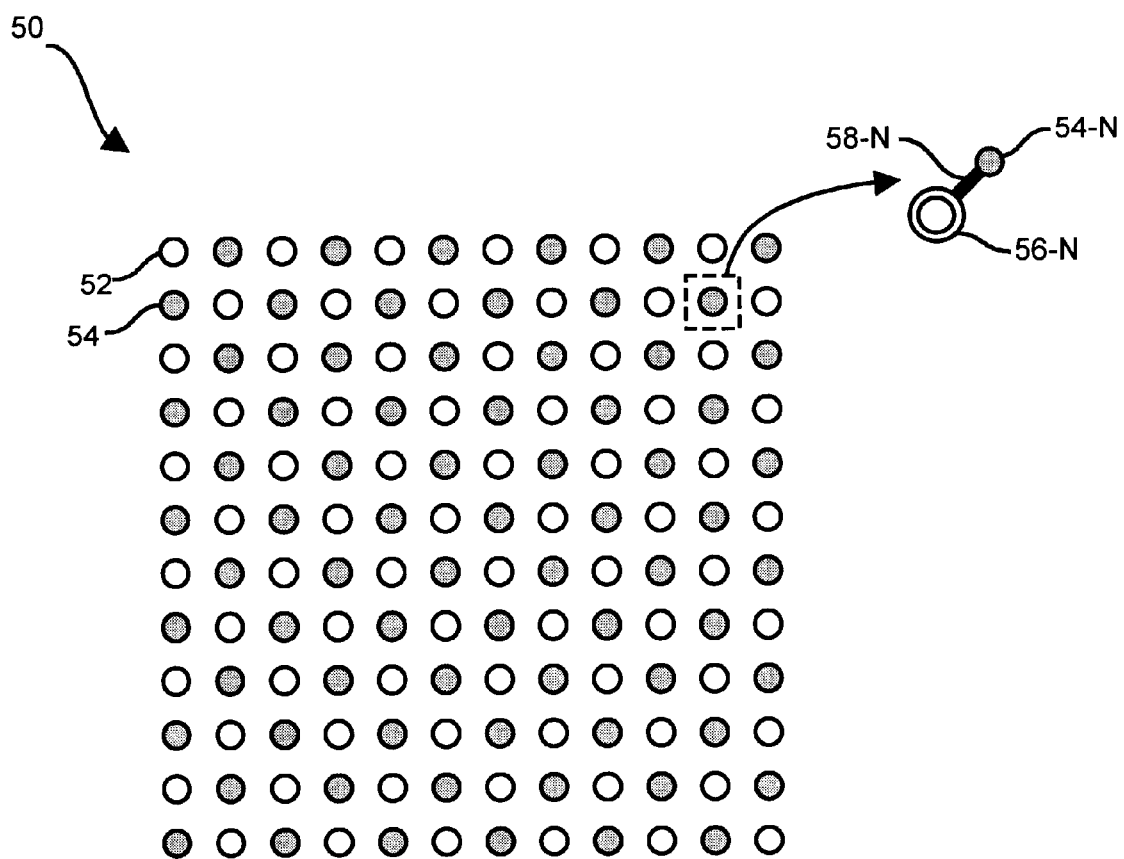
FIG. 2 is a diagram showing a top view of an arrangement of circuit board contacts which forms a set of interconnections between the module and the circuit board of FIG. 1.

FIG. 2 shows a top view of a configuration 50 of contacts (e.g., pads) for the module installation location 28 of the circuit board 22. The configuration 50 includes two sets of contacts: a set of first circuit board contacts 52, and a set of second circuit board contacts 54. Conductive material within the circuit board 22 connects each of the first circuit board contacts 52 together through corresponding vias 56. Similarly, additional conductive material within the circuit board 22 connects each of the second circuit board contacts 54 together through corresponding vias 56. As shown by way of example in FIG. 2, each contact 52, 54 (e.g., contact 54-N) connects with its corresponding via 56 (e.g., via 56-N) through a respective surface connection 58 (e.g., connection 58-N). Alternatively, each contact 52, 54 extends over its corresponding via 56 ("a via in the pad") such that no other surface connection is required.

It should be understood that the contacts 52, 54 are arranged such that each contact 52 is not connected to its closest neighboring contacts 54. Similarly, each contact 54 is not connected to its closest neighboring contacts 52. Further details of the conductive material which connects each of the first circuit board contacts 52 together, and connects each of the second circuit board contacts 54 together will be provided with reference to FIGS. 3A and 3B.

Figure 3A:
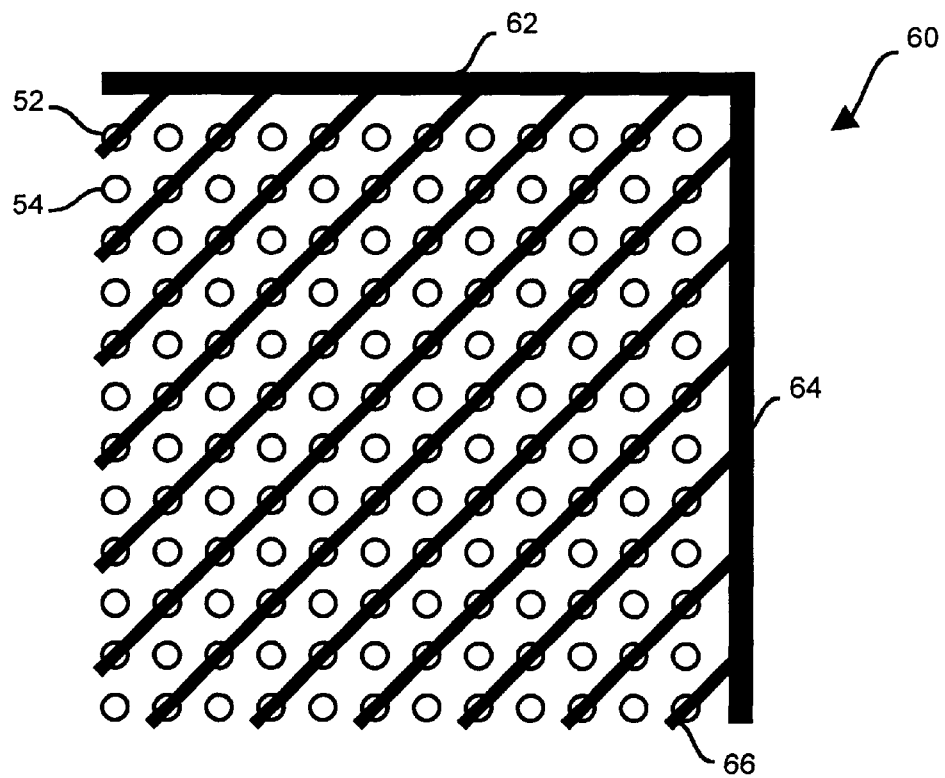
FIG. 3A is a diagram showing a top view of a connection layout which is suitable for use in a layer of the circuit board of FIG. 1.

FIG. 3A shows a top view of a configuration 60 of conductive material which connects each of the first circuit board contacts 52 together. The configuration 60 of conductive material resides within the module installation location 28 of the circuit board 22, but preferably on a circuit board layer other than the top surface of the circuit board 22. The vias 56 are purposefully not shown in FIG. 3A for simplicity.

The configuration 60 includes a main portion 62, and another main portion 64 which is substantially perpendicular to the main portion 62. The configuration 60 further includes multiple portions 66 which extend across the module installation location 28 and diagonally from the main portions 62, 64. As shown in FIG. 3A, all of the first circuit board contacts 52 connect (through vias 56) with multiple portions 66, and none of the second circuit board contacts 54 connect with the multiple portions 66.

Figure 3B:
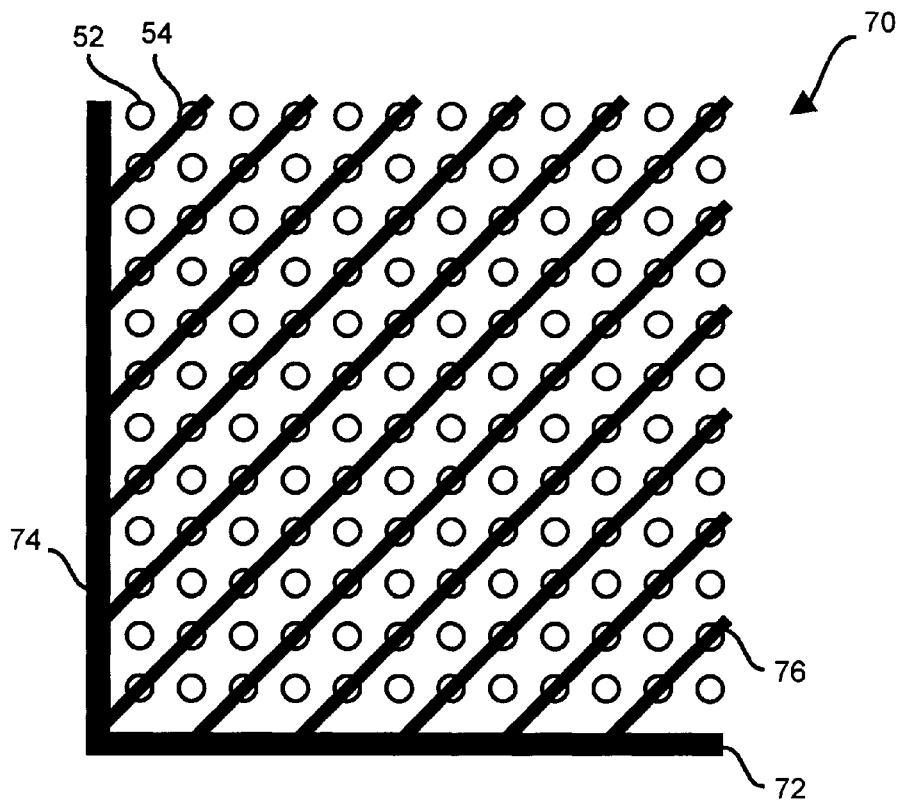
FIG. 3B is a diagram showing a top view of another connection layout which is suitable for use in the circuit board layer of FIG. 3A.

FIG. 3B shows a top view of a configuration 70 of conductive material which connects each of the second circuit board contacts 54 together. In a manner similar to that of the configuration 60 of FIG. 3A, the conductive material configuration 70 resides within the module installation location 28 of the circuit board 22, but preferably on a circuit board layer other than the top surface of the circuit board 22. Again, the vias 56 are purposefully not shown in FIG. 3B for simplicity.

The configuration 70 includes a main portion 72, and another main portion 74 which is substantially perpendicular to the main portion 72. The configuration 70 further includes multiple portions 76 which extend across the module installation location 28 and diagonally from the main portions 72, 74. As shown in FIG. 3B, all of the second circuit board contacts 54 connect (through vias 56) with multiple portions 76, and none of the first circuit board contacts 52 connect with the multiple portions 76.

In one arrangement, the configurations 60 and 70 reside on the same circuit board layer (e.g., the same inner layer of the circuit board 22). In another arrangement, the configurations 60 and 70 reside on different circuit board layers.

Figure 4:
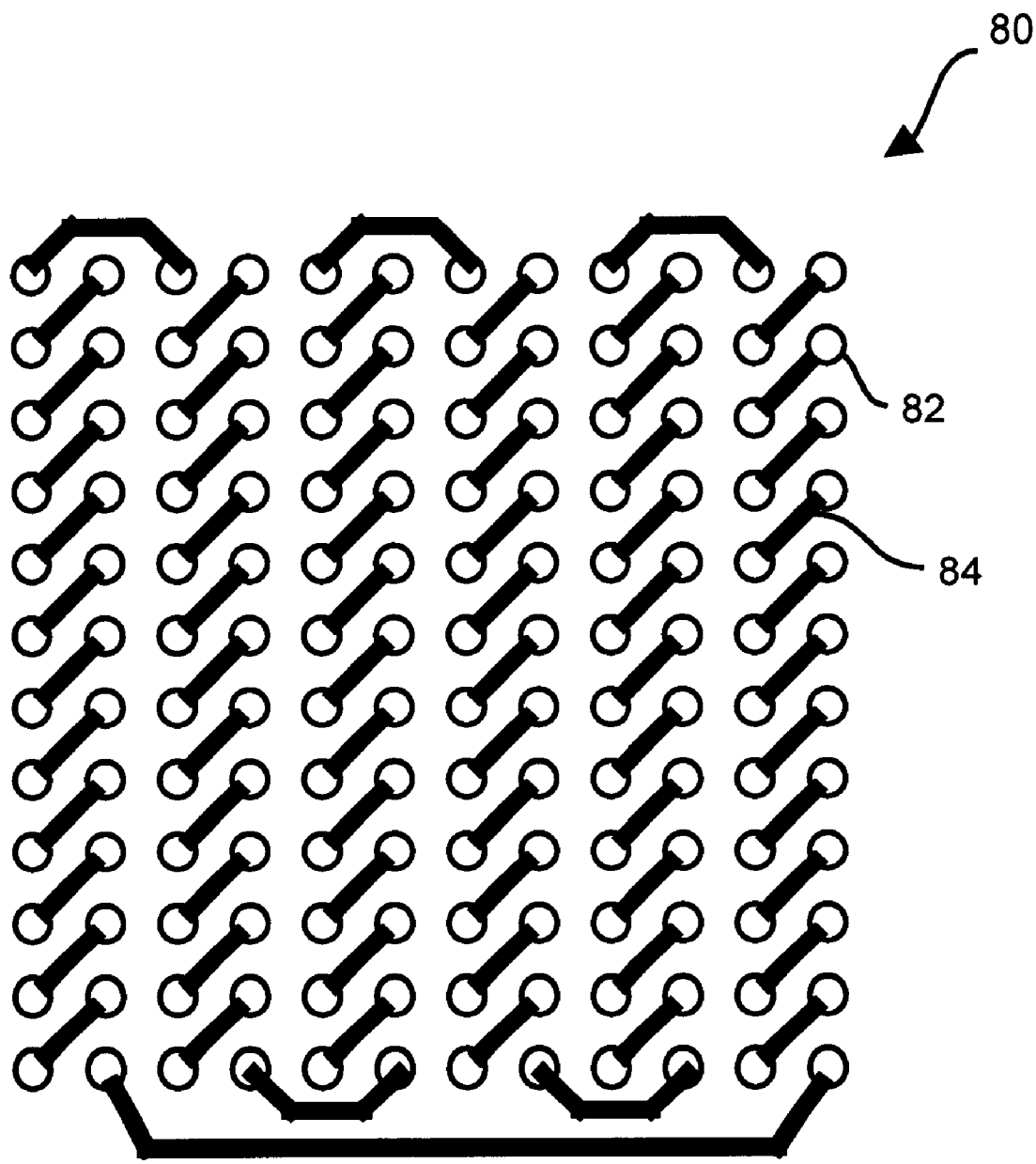
FIG. 4 is a diagram showing a top view of a connection layout which is suitable for use in the module of FIG. 1.

FIG. 4 shows a top view of a configuration 80 of module contacts 82 and conductive material 84 which forms a module wiring pattern that is suitable for use by the module 24 of FIG. 1. The module contacts 82 correspond to the contacts 52, 54 of FIGS. 2, 3A and 3B. When the module 24 is mounted to the circuit board 22, the conductive material 84 connects a set of first module contacts with the set of first circuit board contacts 52, and a set of second module contacts with the set of second circuit board contacts 54. The set of first module contacts and the set of second module contacts are electrically isolated from each other within the module 24. A procedure for obtaining an electrical characteristic of a circuit board assembly process will now be described with reference to FIG. 5.

Figure 5:
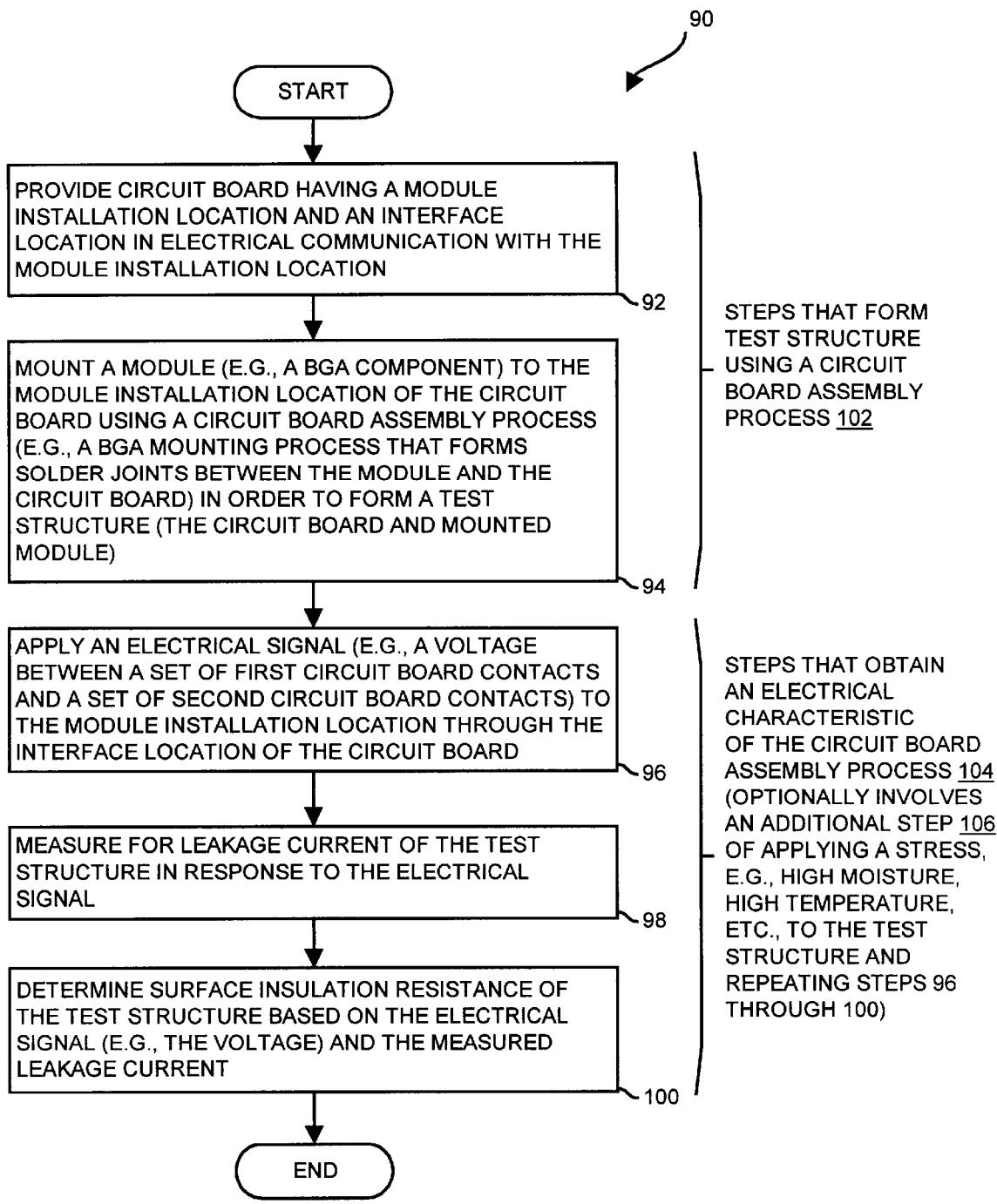
FIG. 5 is a flow diagram illustrating a procedure for forming the test structure of FIG. 1 using the circuit board assembly process, and obtaining the electrical characteristic of the circuit board assembly process.

FIG. 5 shows a procedure 90 which is performed by a user (e.g., a circuit board manufacturer) in order to obtain an electrical characteristic of a circuit board assembly process. In step 92, the user provides a circuit board having a module installation location and an interface location in electrical communication with the module installation location. Step 92 involves formation of the circuit board using various circuit board manufacturing phases of the circuit board assembly process such as creating circuit board layers (e.g., masking, routing, etc.), combining the circuit board layers, drilling holes and installing vias to connect conductive material of different circuit board layers, and applying various solutions and coatings to clean and protect the circuit board. In the provided circuit board of step 92, the interface location provides external access (e.g., to apply and measure electrical signals) to the module installation location.

In step 94, the user mounts a module to the module installation location of the circuit board in order to form a test structure. Step 94 involves installing the module onto the module installation location using a mounting process of the circuit board assembly process. The user preferably places the module and solder (e.g., solder paste containing flux) at the module installation location, and solders the module to the module installation location to form solder joints between the module and the circuit board.

In step 96, the user applies an electrical signal (e.g., a voltage) to the module installation location through the interface location of the circuit board. The user applies the signal to the interface location, and the signal propagates to the module installation location since the module installation location is in electrical communication with the interface location.

In step 98, the user measures a leakage current of the test structure (i.e., the circuit board and mounted module) in response to the electrical signal. The leakage current is an electrical characteristic of the finished circuit board structure. That is, it provides an indication of the electrical properties between connections (e.g., solder joints) formed at the module installation location of the circuit board. In some situations, the circuit board assembly process adequately mounts the module to the module installation location of the circuit board resulting in low leakage current. In other situations, the circuit board assembly process may inadequately mount the module to the module installation location resulting in a high leakage current, perhaps due to an unsuitable arrangement of contacts within the installation location (e.g., too fine a pitch), an unsuitable flux (e.g., a high amount of impurities), poor circuit board cleaning techniques, etc.

In step 100, the user determines the SIR of the test structure based on the electrical signal and the measured leakage current. The SIR is another electrical characteristic of the circuit board assembly process used to form the test structure. In one arrangement, the electrical signal applied in step 96 is a voltage (volts) and the user calculates the SIR by dividing the applied voltage by the leakage current (amps) to obtain the SIR (ohms).

It should be understood that the procedure 90 can be viewed as two main phases. In particular, steps 92 through 94 form a first phase 102 of forming a test structure using a circuit board assembly process. Then, steps 96 through 100 form a second phase 104 of obtaining an electrical characteristic of the circuit board assembly process 104. A circuit board manufacturer may wish to repeat the second phase 104 after applying one or more stresses (e.g., 85 degrees Fahrenheit and 85% humidity for a period of time) to the test structure in order to examine how the test structure or a similar circuit board assembly would react to various conditions.

Further details of how the user performs the procedure 90 of FIG. 5 will now be provided by way of the following example which refers to the system 20 of FIG. 1. A circuit board manufacturer (i.e., a user) provides the circuit board 22 (see FIG. 1), which is suitable for use by the procedure 90 (see step 92). The circuit board 22 includes the module installation location 28, the interface location 30 and conductive material 32 which places the interface location 30 in electrical communication with the module installation location 28.

The circuit board manufacturer then mounts the module 24 to the module installation location 28 of the circuit board 22 in order to form a test structure 38 (step 94). In particular, the module 24 is a BGA module and the manufacturer mounts the module 24 to the module installation location 28 of the circuit board 22 using a BGA mounting process 36 (a portion of a circuit board assembly process) to create the test structure 38.

The circuit board manufacturer then applies an electrical signal to the module installation location 28 through the interface location 30 of the circuit board 22 (step 96). In particular, the manufacturer applies a voltage to the module installation location 28 using the signal generator 42 of the equipment 26. In one arrangement, the module installation location 28 includes the configuration 50 (see FIG. 2) having two sets of contacts: the set of first circuit board contacts 52, and the set of second circuit board contacts 54. In this arrangement, the signal generator 42 preferably provides, through the interface location 30, a voltage between 10 volts and 20 volts (as the electrical signal) between the two sets of circuit board contacts 52, 54.

Next, the manufacturer measures leakage current of the test structure 38 in response to the electrical signal (step 98). In particular, the manufacturer uses the detector 44 of the equipment 26 to measure leakage current between the set of first circuit board contacts 52 and the set of second circuit board contacts 54.

Then, the manufacturer determines the SIR of the test structure 38 based on the applied electrical signal, i.e., the applied voltage, and the measured leakage current (step 100). In particular, the manufacturer divides the applied voltage (e.g., 10 volts) by the measured leakage current. A high SIR indicates that the circuit board assembly process adequately mounted the module 24 to the circuit board 22, and that the process will likely mount a similar operating module to the circuit board (or a similar circuit board). However, a low SIR indicates that the circuit board assembly process has inadequately mounted the module 24 to the circuit board 22. For a low SIR, the manufacturer may wish to examine the circuit board assembly process in detail to determine the cause of the low SIR (e.g., an unsuitable contact pitch or density, excess flux or contaminants in the module installation location 28, inadequate cleaning steps, etc.).

It should be understood that the above-described procedure 90 which uses the test structure 38 having the BGA module 24 mounted on the circuit board 22 more closely resembles the electrical attributes of an operating BGA module mounted to a circuit board than a conventional comb structure having lateral-extending etch runs. This is because the conventional comb structure mimics circuit board line width and pattern spacing rather than dimensions at a module installation location. In contrast, the test structure 38 provides electrical attributes (e.g., contact dimensions, solder joint conditions, etc.) at the module installation location 28 which are similar to an operating BGA module mounted on at a similar installation location.

Figure 6:
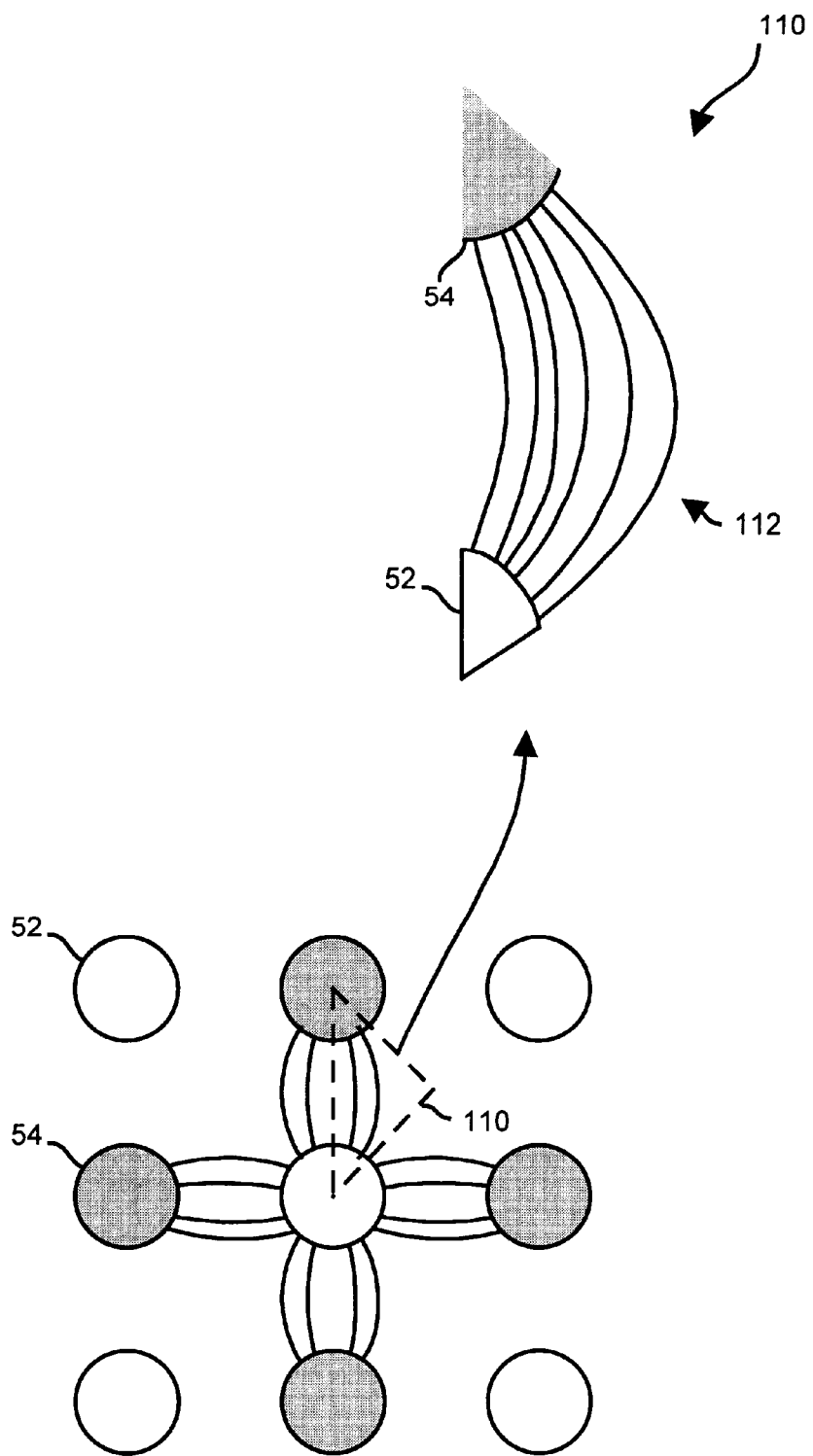
FIG. 6 is a diagram of a cell formed by the test structure of FIG. 1 when an electrical signal is applied to the test structure.

FIG. 6. illustrates electrical attributes of the test structure 38 at a lower level when the test structure 38 uses the contact configuration 50 of FIG. 2. In particular, as shown in FIG. 6, the contacts 52, 54 of the circuit board 22 form cells 110 having voltage gradient lines 112. A close-up of a cell 110 shows that the voltage gradient lines 112 extend radially between the contacts 52, 54 when the contacts have different voltages. The situation is similar to what occurs between two closely located contacts which carry different voltages (e.g., different signals) at a module installation location between an operating BGA module and a circuit board. It is useful to model the configuration 50 in terms of a repeating cell 110 since BGA modules requiring a large number of ball connections tend to amplify the measured and calculated electrical characteristics (e.g., leakage current, SIR, etc.). For example, there are $(4N^2-4N)$ test cells for an N×N array.

It should be understood that, the cell 110 is quite different from the cells formed by a conventional comb structure having laterally-extending etch runs carrying different voltages in an interleaved manner (i.e., cells having straight voltage gradient lines which extend longitudinally between the laterally-extending etch runs). Accordingly, the procedure 90 using the test structure 38 is better suited in its ability to provide meaningful electrical characteristic information (e.g., leakage current, SIR, etc.) indicative of BGA technology.

Figure 7:
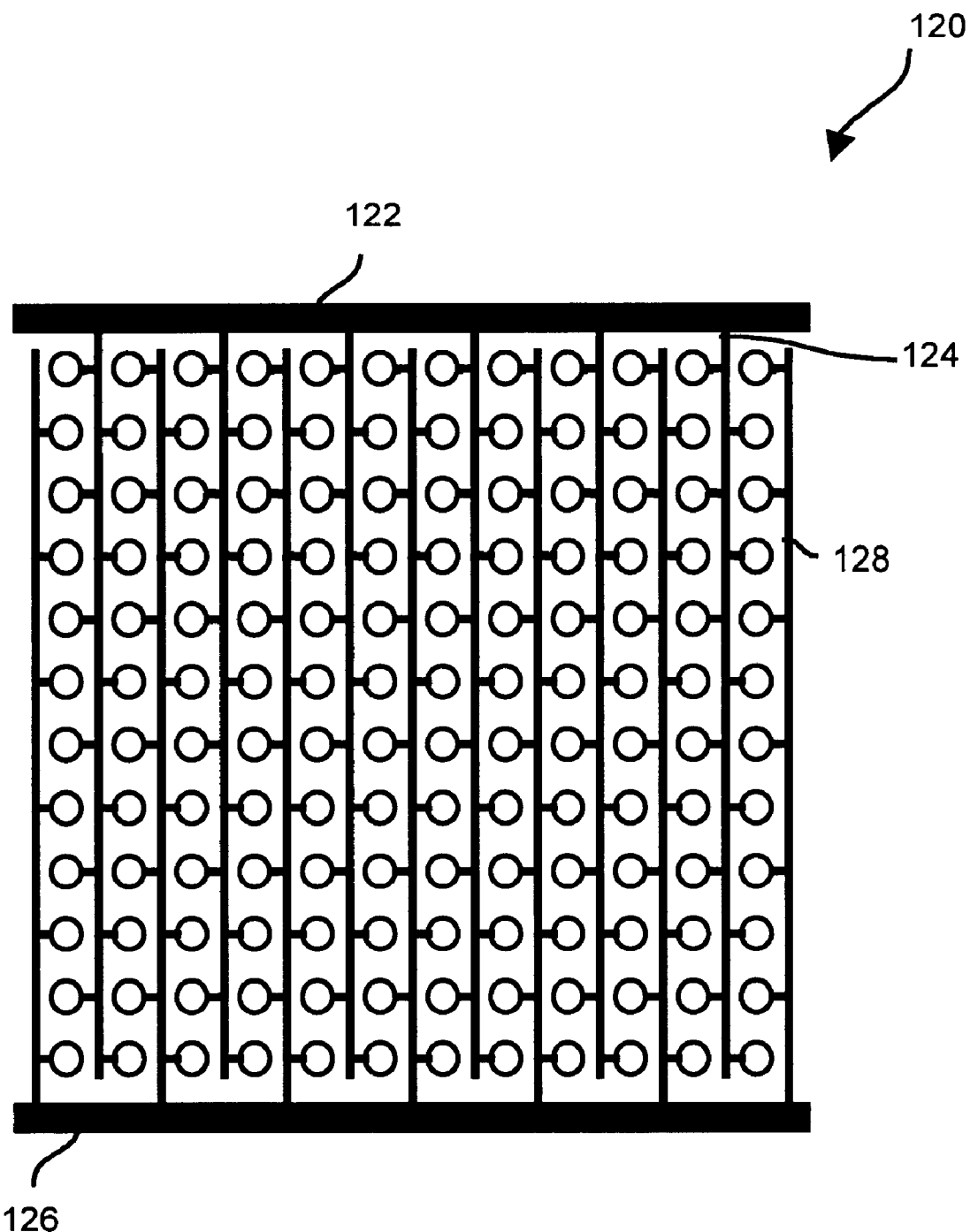
FIG. 7 is a diagram showing a top view of an alternative connection layout which is suitable for use in a layer of the circuit board of FIG. 1.

It should be understood that configurations of conductive material other than that shown in FIGS. 3A and 3B are suitable for use in the circuit board 22 for connecting the sets of circuit board contacts 52 and 54 of FIG. 2. FIG. 7 shows, by way of example only, a top view of an alternative configuration 120 of conductive material which is suitable for connecting the sets of circuit board contacts 52 and 54. The configuration 120 includes a main portion 122 and multiple portions 124 which extend across the module installation location 28. The portions 126 electrically connect with the set of first circuit board contacts 52 (also see FIG. 2) through corresponding vias 56 (not shown in FIG. 7 for simplicity). Similarly, the configuration 120 further includes another main portion 126 and multiple portions 128 which extend across the module installation location 28, and electrically connect with the set of second circuit board contacts 54 through corresponding vias 56. The configuration 120 is suitable for use on a single layer of the circuit board 22 (e.g., an inner layer).

Figure 8:
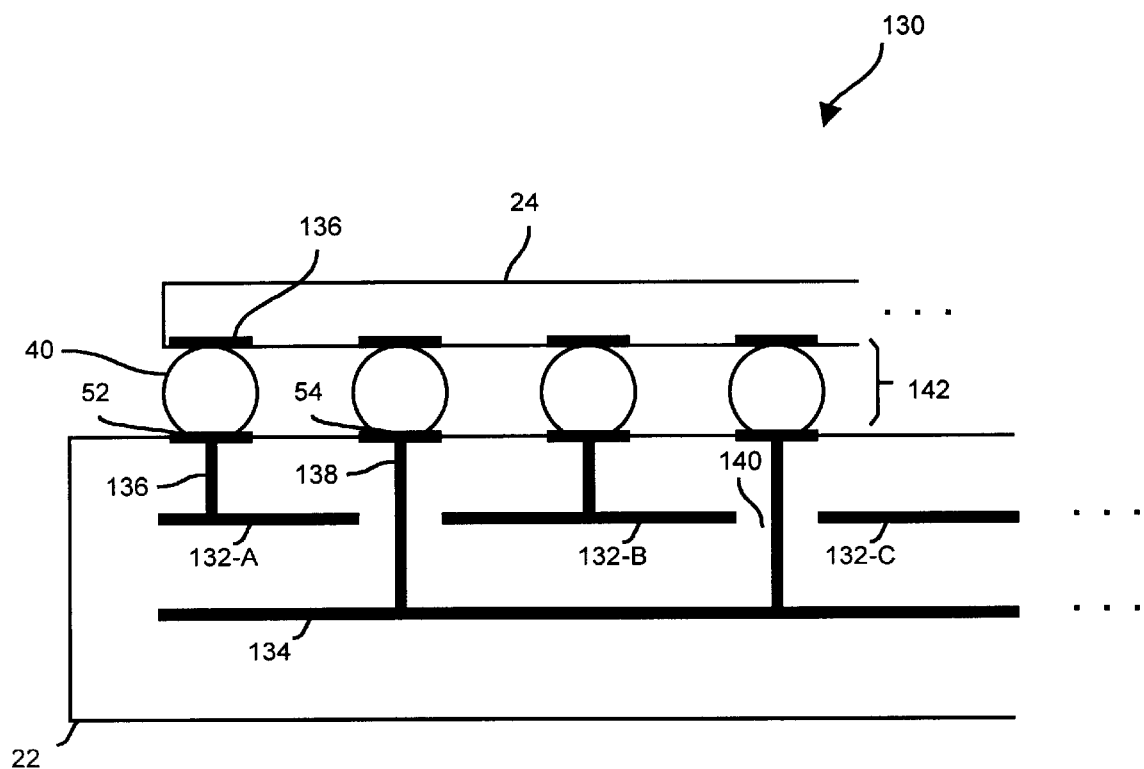
FIG. 8 is a diagram showing a side view of yet another connection layout which is suitable for use in multiple layers of the circuit board of FIG. 1.

FIG. 8 shows a side view of a portion of another configuration 130 of conductive material which is suitable for use in connecting the sets of circuit board contacts 52, 54 of FIG. 2. In the configuration 130, the circuit board 22 includes a first conductive plane 132 and a second conductive plane 134 which extend across the module installation location 28 (an perhaps across other module installation locations as well). The first conductive plane 132 connects with each of first circuit board contacts 52 through blind vias 136, while the second conductive plane 134 connects with each of the second circuit board contacts 54 through blind vias 138. Although the first conductive plane 132 is shown as three segments 132-A, 132-B and 132-C, it should be understood that the first conductive plane 132 is contiguous but includes drilled holes 140 to enable the second conductive plane to connect with the second circuit board contacts 54 (e.g., through vias 56). As shown by way of example only, the solder balls 40 of the module 24 form solder joints 142 between the contacts 52, 54 of the circuit board 22 and the contacts 82 of the module 24. In an alternative arrangement, the vias 136 extend through drilled holes in the second conductive plane 134 to the bottom of the circuit board 22.

Figure 9:
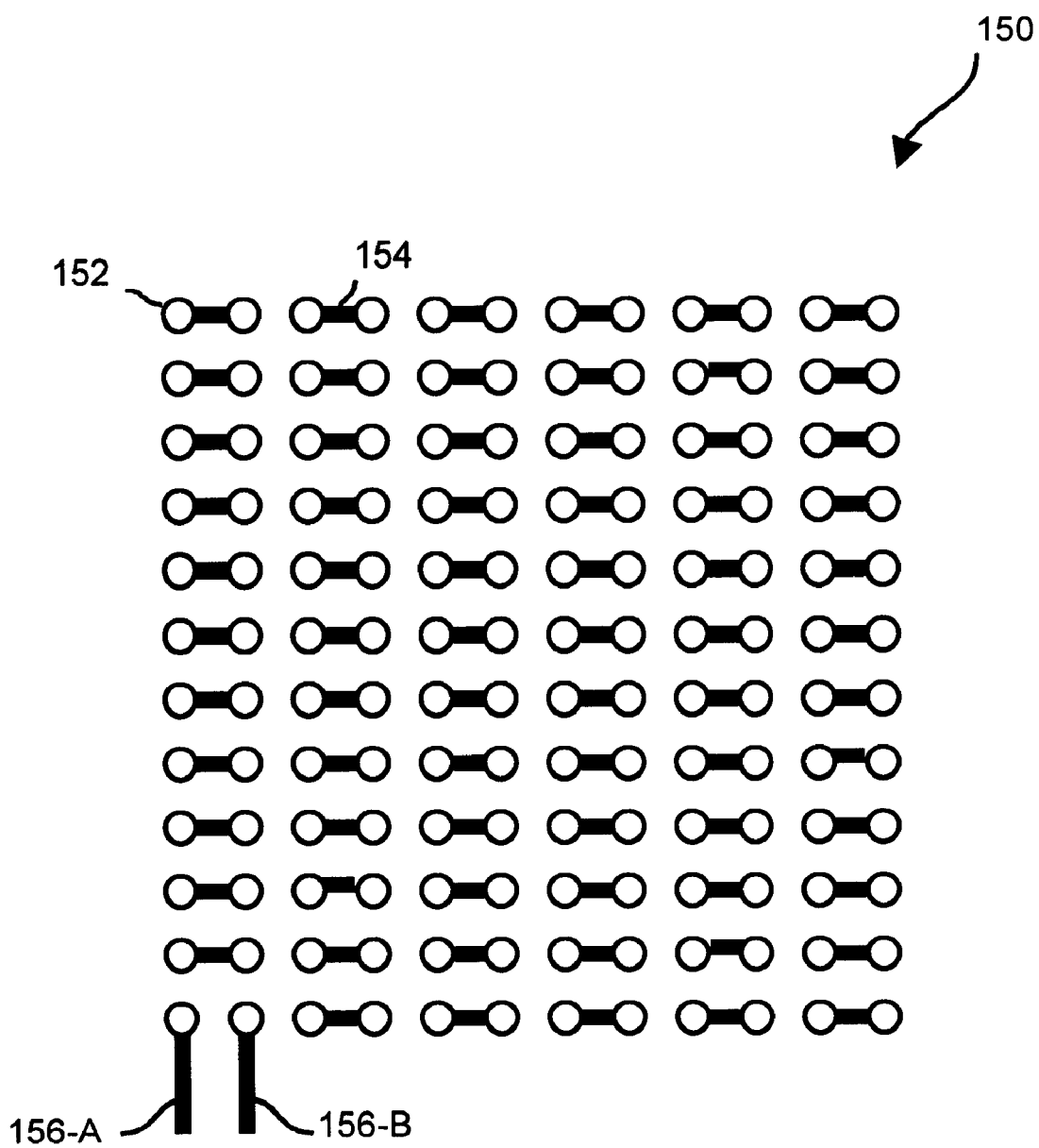
FIG. 9 is a diagram showing a top view of a connection layout which is suitable for use in the circuit board of FIG. 1 to form a daisy chain connection configuration between the module and the circuit board.

It should be understood that the module 24 having the conductive material configuration 50 of FIG. 4 can serve as a dual purpose test vehicle. That is, the module 24 can be used on other module installation locations for other tests (e.g., in the location 34 of the circuit board 22, see FIG. 1). FIG. 9 shows, by way of example only, a top view of a configuration 150 of conductive material which is suitable for use in another module installation location for a continuity test. The configuration 150 includes contacts 152, conductive material 154 (e.g., on an inner circuit board layer), and end connections 156-A and 156-B. When the module 24 mounts to the contacts 152, i.e., forms solder joints with the contacts 152, a single pathway is formed between the end connections 156-A and 156-B that daisy chains the solder joints. The equipment 26 can be connected to the end connections 156-A and 156-B to test continuity through the formed pathway thus providing another use for the module 24 (i.e., to determine the adequacy of a mounting procedure of a circuit board assembly process). Accordingly, a batch of the same module 24 can be manufactured and used for multiple circuit board assembly process tests to spread the costs of the module 24 over multiple tests.

It should be understood that the techniques of the invention enable a user (e.g., a circuit board manufacturer) to duplicate and test materials, structure or configurations present in many current and new circuit board assemblies in order to obtain electrical characteristics of particular circuit board assembly processes. For example, the techniques of the invention enable a circuit board manufacturer to determine how close BGA connections can be brought together before leakage current becomes a problem. The features of the invention may be particularly useful when applied to devices manufactured by EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

Figure 10:
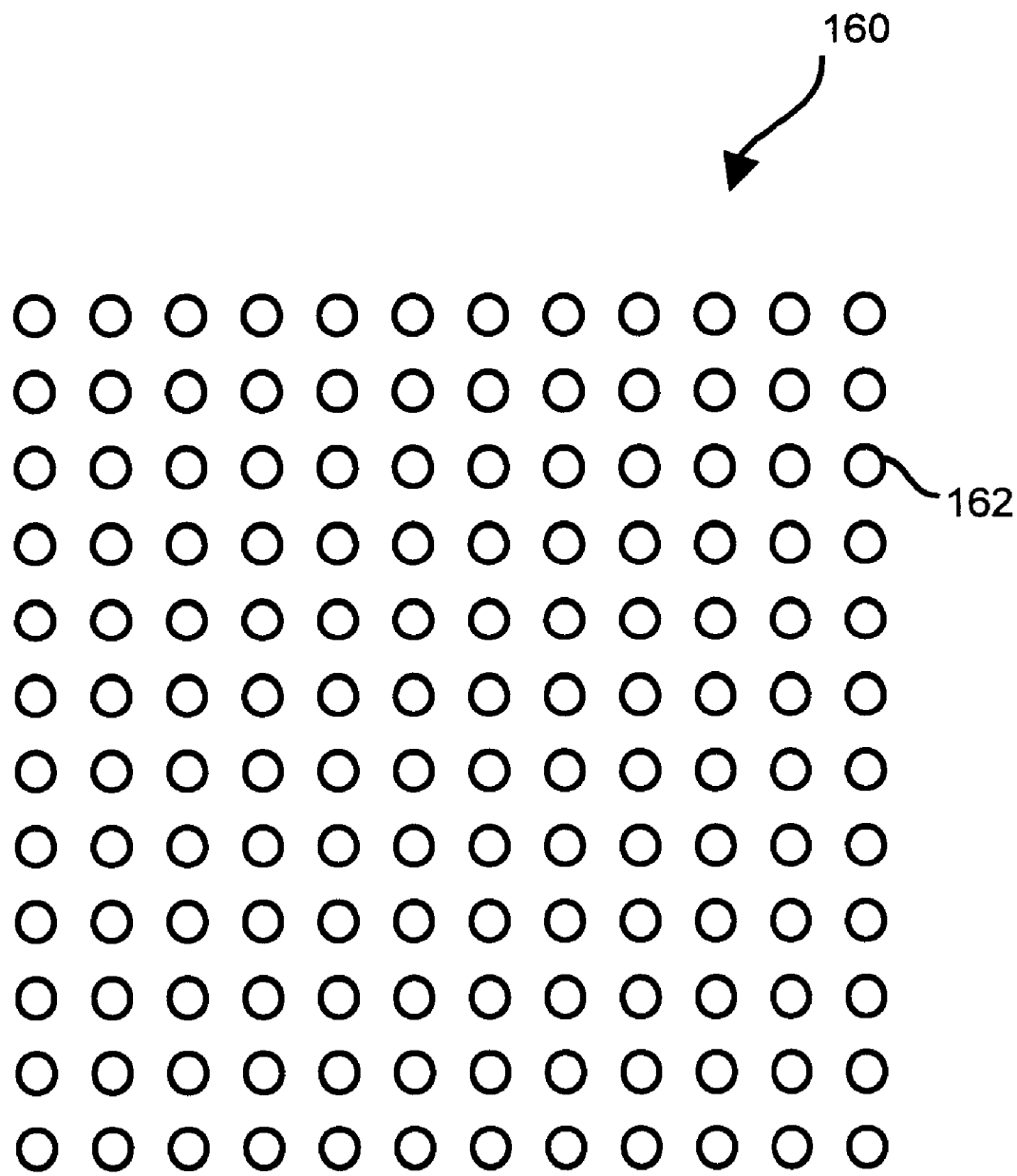
FIG. 10 is a diagram showing a top view of an alternative connection layout which is suitable for use in the module of FIG. 1.

For example, the circuit board 22 and the module 24 can have other conductive material configurations other than those shown in FIGS. 3A, 3B, 4, 7 and 8. For example, FIG. 10 shows an alternative configuration 160 for the module 24. The configuration 160 includes module contacts 162 but no conductive material to connect any of the module contacts 162. Accordingly, if a module 24 having the configuration 160 is mounted to the module installation location 28 of the circuit board 22, all of the circuit board contacts 52, 54 (see FIG. 2) would terminate at the module contacts 160 rather than connect to other circuit board contacts.

Furthermore, it should be understood that FIG. 2 shows a top view of a 12×12 contact layout 50 for the module 24 by way of example only. Other layouts are suitable for the contact layout such as an N×M layout where N and M are different integers. Moreover, the module layout does not need to be an array. Rather, the module layout can have other shapes. For example, another suitable layout includes P rows of contacts (e.g., four rows) around the perimeter of the module with no contacts located in the interior portion of the module.

Additionally, it should be understood that the module 24 is shown as a BGA module by way of example only. Other packaging and mounting technologies (e.g., lead frame packaging and mounting technologies) are suitable for use by the invention. In particular, as new packaging and mounting technologies are developed and included within circuit board assembly processes, the invention can be used to obtain electrical characteristics of these technologies.

Furthermore, the above-described techniques can be applied to test for electrical characteristics other than leakage current and surface insulation resistance such as field effects, inductance, cross-talk, etc. In some arrangements, the applied electrical signal need not be a DC voltage. Rather, it can be other signals such as alternating current, high frequency signals, etc.

What is claimed is:

1. A system for obtaining an electrical characteristic of a circuit board assembly process, the system comprising:
   a test structure that includes (i) a circuit board having a module installation location and an interface location in electrical communication with the module installation location, and (ii) a module which is mounted to the circuit board at the module installation location using a circuit board assembly process;
   a signal generator that couples to the interface location of the circuit board, and that applies an electrical signal to the module installation location of the circuit board through the interface location; and a detector that couples to the interface location, and that measures leakage current of the test structure in response to the electrical signal.

2. The system of claim 1 wherein the module includes a Ball Grid Array package, and wherein the circuit board assembly process includes a Ball Grid Array component mounting process.

3. The system of claim 1 wherein the module is soldered to the circuit board at the module installation location using a soldering process.

4. The system of claim 3 wherein the circuit board and the module, which is soldered to the circuit board using the soldering process, form a first electrical pathway and a second electrical pathway which is unconnected with the first electrical pathway in order to provide a signal identifying an amount of leakage current through the test structure in response to the electrical signal.

5. The system of claim 1 wherein the detector is configured to detect a signal indicating an amount of leakage current through the test structure.

6. The system of claim 5 wherein signal generator applies, as the electrical signal, a voltage having a voltage value; wherein the signal indicating the amount of leakage current through the test structure is a current value; and wherein the voltage value and the current value indicate a surface insulation resistance value of the test structure.

7. The system of claim 1 wherein the detector is configured to provide, as the leakage current measured by the detector, an amperage value indicating an amount of current passing through the test structure in response to the electrical signal.

8. A test structure for providing an electrical characteristic of a circuit board assembly process, the test structure comprising:

a circuit board having a module installation location and an interface location; and a module mounted to the circuit board at the module installation location using a circuit board assembly process, such that an electrical signal applied to the module installation location of the circuit board through the interface location of the circuit board enables measurement of leakage current of the test structure in response to the electrical signal.

9. The test structure of claim 8 wherein the module includes a Ball Grid Array package, and wherein the circuit board assembly process includes a Ball Grid Array component mounting process.

10. The test structure of claim 8 wherein the module installation location of the circuit board includes (i) a set of first circuit board contacts which are electrically connected together, and (ii) a set of second circuit board contacts which are electrically connected together; and wherein the module includes (i) a set of first module contacts which connects with the set of first circuit board contacts, and (ii) a set of second module contacts which connects with the set of second circuit board contacts and which is electrically isolated from the set of first module contacts.

11. The test structure of claim 8 wherein the module and the circuit board form a set of cells when the electrical signal is applied to the module installation location of the circuit board, each cell having voltage gradient lines which radially extend between solder joints connecting the module to the circuit board.

12. The test structure of claim 8 wherein the module installation location of the circuit board includes an array of contacts and a set of electrical connections, wherein each contact of an inner portion of the array has four immediately adjacent neighboring contacts, and wherein the set of electrical connections connects each contact of the inner portion to a contact other than one of the four immediately adjacent neighboring contacts of that contact.

13. The test structure of claim 8 wherein the module is soldered to the circuit board at the module installation location using a soldering process.

14. The test structure of claim 13 wherein the circuit board and the module, which is soldered to the circuit board using the soldering process, form a first electrical pathway and a second electrical pathway which is unconnected with the first electrical pathway in order to provide a signal identifying an amount of leakage current through the test structure in response to the electrical signal.

15. A test structure for providing an electrical characteristic of a circuit board assembly process, the test structure comprising:

a circuit board having a module installation location and an interface location; and a module mounted to the circuit board at the module installation location using a circuit board assembly process, such that an electrical signal applied to the module installation location of the circuit board through the interface location of the circuit board enables measurement of leakage current of the test structure in response to the electrical signal, wherein the module installation location of the circuit board includes a set of first contacts and a set of second contacts, and wherein the electrical signal is a voltage applied between the set of first contacts and the set of second contacts in order to determine, as the electrical characteristic, a surface insulation resistance of the test structure based on the voltage and the leakage current.

16. A method for forming a test structure for obtaining an electrical characteristic of a circuit board assembly process, the method comprising the steps of:

providing a circuit board having a module installation location and an interface location in electrical communication with the module installation location; and mounting a module to the module installation location of the circuit board using a circuit board assembly process in order to form a test structure, such that an electrical signal applied to the module installation location of the circuit board through the interface location enables measurement of leakage current of the test structure in response to the electrical signal.

17. The method of claim 16 wherein the module includes a Ball Grid Array package, and wherein the step of mounting includes the step of:

soldering the Ball Grid Array package to the module installation location of the circuit board using a Ball Grid Array component mounting process, as a portion of the circuit board assembly process.

18. The method of claim 16 wherein the module installation location of the circuit board includes (i) a set of first circuit board contacts which are electrically connected together, and (ii) a set of second circuit board contacts which are electrically connected together; wherein the module includes (i) a set of first module contacts, and (ii) a set of second module contacts which is electrically isolated from the set of first module contacts; and wherein the step of mounting includes the step of:

connecting the set of first module contacts to set of first circuit board contacts, and connecting the set of second module contacts to the set of second circuit board contacts.

19. The method of claim 16 wherein the step of mounting includes the step of:

forming solder joints between the module and the circuit board in order to form a set of cells when the electrical signal is applied to the module installation location of the circuit board, each cell having voltage gradient lines which radially extend between the solder joints connecting the module to the circuit board.

20. The method of claim 16 wherein the module installation location of the circuit board includes an array of contacts and a set of electrical connections, wherein each contact of an inner portion of the array has four immediately adjacent neighboring contacts, and wherein the set of electrical connections connects each contact of the inner portion to a contact other than one of the four immediately adjacent neighboring contacts of that contact.

21. The method of claim 16 wherein the step of mounting includes the step of:

soldering the module to the circuit board using a soldering process such that a first electrical pathway and a second electrical pathway which is unconnected with the first electrical pathway are formed in order to provide a signal identifying an amount of leakage current through the test structure in response to the electrical signal.

22. The method of claim 16, further comprising the step of:

detecting a signal indicating an amount of leakage current through the test structure.

23. The method of claim 22, further comprising the step of:

applying, as the electrical signal, a voltage having a voltage value such that the signal indicating the amount of leakage current through the test structure is a current value, and wherein the voltage value and the current value indicate a surface insulation resistance value of the test structure.

24. A method for forming a test structure for obtaining an electrical characteristic of a circuit board assembly process, the method comprising the steps of:

providing a circuit board having a module installation location and an interface location in electrical communication with the module installation location; and mounting a module to the module installation location of the circuit board using a circuit board assembly process in order to form a test structure, such that an electrical signal applied to the module installation location of the circuit board through the interface location enables measurement of leakage current of the test structure in response to the electrical signal, wherein the module installation location of the circuit board includes a set of first contacts and a set of second contacts, and wherein the electrical signal is a voltage applied between the set of first contacts and the set of second contacts in order to determine, as the electrical characteristic, a surface insulation resistance of the test structure based on the voltage and the leakage current.

25. A method for obtaining an electrical characteristic of a circuit board assembly process, the method comprising the steps of:

providing a test structure that includes (i) a circuit board having a module installation location and an interface location in electrical communication with the module installation location, and (ii) a module which is mounted to the circuit board at the installation location;

applying an electrical signal to the module installation location of the circuit board through the interface location of the circuit board; and measuring leakage current of the test structure in response to the electrical signal.

26. The method of claim 25 wherein the module includes a Ball Grid Array package, and wherein the step of providing includes the step of:

mounting the Ball Grid Array package to the module installation location of the circuit board using a Ball Grid Array component mounting process, as a portion of the circuit board assembly process.

27. The method of claim 25 wherein the module installation location of the circuit board includes (i) a set of first circuit board contacts which are electrically connected together, and (ii) a set of second circuit board contacts which are electrically connected together; wherein the module includes (i) a set of first module contacts, and (ii) a set of second module contacts which is electrically isolated from the set of first module contacts; and wherein the step of providing includes the step of:

mounting the module to the module installation location of the circuit board such that the set of first module contacts connect to set of first circuit board contacts, and the set of second module contacts connect to the set of second circuit board contacts.

28. The method of claim 25 wherein the step of providing includes the step of:

mounting the module to the module installation location of the circuit board such that solder joints form between the module and the circuit board in order to form a set of cells when the electrical signal is applied to the module installation location of the circuit board, each cell having voltage gradient lines which radially extend between the solder joints connecting the module to the circuit board.

29. The method of claim 25 wherein the module installation location of the circuit board includes an array of contacts and a set of electrical connections, wherein each contact of an inner portion of the array has four immediately adjacent neighboring contacts, and wherein the set of electrical connections connects each contact of the inner portion to a contact other than one of the four immediately adjacent neighboring contacts of that contact.

30. The method of claim 25, further comprising the step of:

exposing the test structure to an extreme environmental condition for a period of time in order to stress the test structure prior to the steps of applying and measuring.

31. The method of claim 25 wherein the step of providing the test structure includes the step of:

soldering the module to the circuit board using a soldering process such that a first electrical pathway and a second electrical pathway which is unconnected with the first electrical pathway are formed in order to provide a signal identifying an amount of leakage current through the test structure in response to the electrical signal.

32. The method of claim 25 wherein the step of measuring includes the step of:

detecting a signal indicating an amount of leakage current through the test structure.

33. The method of claim 32 wherein the step of applying the electrical signal includes the step of:

providing, as the electrical signal, a voltage having a voltage value such that the signal indicating the amount of leakage current through the test structure is a current value, and wherein the voltage value and the current value indicate a surface insulation resistance value of the test structure.

34. The method of claim 25 wherein the step of measuring leakage current includes the step of:

obtaining, as the leakage current, an amperage value indicating an amount of current passing through the test structure in response to the electrical signal.

35. A method for obtaining an electrical characteristic of a circuit board assembly process, the method comprising the steps of:

providing a test structure that includes (i) a circuit board having a module installation location and an interface location in electrical communication with the module installation location, and (ii) a module which is mounted to the circuit board at the installation location;

applying an electrical signal to the module installation location of the circuit board through the interface location of the circuit board;

measuring leakage current of the test structure in response to the electrical signal, wherein the module installation location of the circuit board includes a set of first contacts and a set of second contacts, and wherein the electrical signal is a voltage applied between the set of first contacts and the set of second contacts; and determining, as the electrical characteristic, a surface insulation resistance of the test structure based on the voltage and the leakage current.

\* \* \* \* \*

UNITED STATES PATENT AND TRADEMARK OFFICE
CERTIFICATE OF CORRECTION

PATENT NO. : 6,535,005 B1
DATED : March 18, 2003
INVENTOR(S) : Daniel Field

It is certified that error appears in the above-identified patent and that said Letters Patent is hereby corrected as shown below:

<u>Title page,</u>
Item [54], "CHARACTERISTICS" should read -- CHARACTERISTIC --.

Signed and Sealed this

Twenty-seventh Day of January, 2004

JON W. DUDAS
*Acting Director of the United States Patent and Trademark Office*